(12) United States Patent
Lee et al.

(10) Patent No.: US 8,287,792 B2
(45) Date of Patent: Oct. 16, 2012

(54) METHODS OF FORMING FINE PATTERNS USING A NANOIMPRINT LITHOGRAPHY

(75) Inventors: Jeong-Hoon Lee, Yongin-si (KR); Jeong-Ho Yeo, Suwon-si (KR); Joo-On Park, Suwon-si (KR); In-Sung Kim, Suwon-si (KR); Doo-Hoon Goo, Hwaseong-si (KR); Jin-Hong Park, Hwaseong-si (KR); Chang-Min Park, Incheon (KR)

(73) Assignee: Samsung Electronics Co., Ltd. (KR)

( * ) Notice: Subject to any disclaimer, the term of this patent is extended or adjusted under 35 U.S.C. 154(b) by 208 days.

(21) Appl. No.: 12/657,750

(22) Filed: Jan. 27, 2010

(65) Prior Publication Data

US 2010/0190340 A1    Jul. 29, 2010

(30) Foreign Application Priority Data

Jan. 29, 2009  (KR) .................. 10-2009-0006772

(51) Int. Cl.
  *B29C 59/00*  (2006.01)
(52) U.S. Cl. .......... 264/293; 264/447; 977/887
(58) Field of Classification Search .......... 264/293, 264/496; 977/887
  See application file for complete search history.

(56) References Cited

U.S. PATENT DOCUMENTS

| 6,653,030 | B2 * | 11/2003 | Mei et al. .................. 430/5 |
| 7,019,835 | B2 | 3/2006 | McMackin et al. |
| 2005/0158637 | A1 | 7/2005 | Kim et al. |
| 2005/0185169 | A1 | 8/2005 | McMackin et al. |
| 2007/0031505 | A1 * | 2/2007 | Roy et al. .................. 424/490 |
| 2008/0182081 | A1 | 7/2008 | Jeon et al. |

FOREIGN PATENT DOCUMENTS

| KR | 10-2005-0075066 A | 7/2005 |
| KR | 10-0643684 B1 | 11/2006 |
| KR | 10-2006-0126709 A | 12/2006 |
| KR | 10-0756283 B1 | 8/2007 |

* cited by examiner

*Primary Examiner* — Yogendra Gupta
*Assistant Examiner* — Robert J Grun
(74) *Attorney, Agent, or Firm* — Onello & Mello, LLP

(57) ABSTRACT

In a method of forming fine patterns, a photocurable coating layer is formed on a substrate. A first surface of a template makes contact with the photocurable coating layer. The first surface of the template includes at least two first patterns having a first dispersion degree of sizes, and at least one portion of the first surface of the template includes a photo attenuation member. A light is irradiated onto the photocurable coating layer through the template to form a cured coating layer including second patterns having a second dispersion degree of sizes. The second patterns are generated from the first patterns and the second dispersion degree is less than the first dispersion degree. The template is separate from the cured coating layer. A size dispersion degree of the patterns used in a nanoimprint lithography process may be adjusted by the light attenuation member, so that the fine patterns may be formed to have an improved size dispersion degree.

11 Claims, 7 Drawing Sheets

US 8,287,792 B2

METHODS OF FORMING FINE PATTERNS USING A NANOIMPRINT LITHOGRAPHY

RELATED APPLICATION

This U.S. nonprovisional patent application relies for priority under 35 U.S.C. 119 on Korean Patent Application No. 10-2009-0006772, filed in the Korean Intellectual Property Office on Jan. 29, 2009, the entire contents of which are incorporated herein by reference.

BACKGROUND

1. Field

Example embodiments relate to methods of forming fine patterns. More particularly, example embodiments relate to methods of forming fine patterns using a nanoimprint lithography.

2. Description of the Related Art

As an integration degree of a semiconductor device has been increased, a reliable patterning technique for manufacturing the semiconductor device with a nanometer scale has been required. Although photolithography process has been widely employed in forming fine patterns of an integrated circuit, the photolithography process has reached some limits of reducing a line width of a pattern and improving a resolution thereof. These limits may be caused by factors such as an interference of light caused light having a wave length of below about 100 nm, a resolution limit of a photoresist, etc. Thus, novel techniques such as electron beam lithography, X-ray lithography, scanning probe lithography, nanoimprint lithography or microcontact printing have been suggested for forming fine patterns instead of the photolithography process.

In the nanoimprint lithography, fine patterns are obtained by pressing a substrate coated by a resin composition with a mold (referred to as a die, a stamper or a template) having fine patterns engraved by an electron beam lithography process or an etching process. For example, the fine patterns may be formed on the substrate coated with a thermoplastic resin by transferring the fine patterns of the mold to the thermoplastic resin while heating the substrate above a glass transition temperature when the nanoimprint lithograthy process is carried out using the thermoplastic resin, The nanoimprint lithography process may be widely employed in manufacturing various products such as an integrated circuit device, a biochip, an optical memory media, an optical waveguide, etc. The nanoimprint lithography process has some advantages that width of the fine patterns are reduced orders of nanometers. However, the nanoimprint lithography process still have disadvantages that the mold for the fine patterns may not be easily accomplished, the fine patterns in large area may be irregular, polymer residues may remain after the nanoimprint process, an alignment between the mold and the substrate may be difficult, etc.

SUMMARY

Example embodiments provide methods of forming fine patterns having an improved size dispersion degree by being adjusted size dispersion degree of patterns of a template.

According to one aspect, the inventive concept is directed to a method of manufacturing fine patterns. In the method, a photocurable coating layer is formed on a substrate. A first surface of a template including a light attenuation member makes contact with the photocurable coating layer. The first surface includes a plurality of first patterns having a first size dispersion degree. A light is irradiated onto the photocurable coating layer through the template to form a cured coating layer including second patterns having a second size dispersion degree. The second patterns are caused from the first patterns and the second size dispersion degree is smaller than the first size dispersion degree. The template is separate from the cured coating layer.

In example embodiments, the template may include a transparent material.

In example embodiments, the template may include quartz or glass.

In example embodiments, the light attenuation member may locally reduce an intensity of the light passing through the template.

In example embodiments, the light attenuation member includes micro bubbles or an optical filter.

In example embodiments, the micro bubbles may be formed by a partial deformation of the template.

In example embodiments, the template may include a first region including some of the first patterns having a first size deviation and a second region including others of the first patterns having a second size deviation greater than the first deviation.

In example embodiments, the micro bubbles may be disposed in the second region of the template.

In example embodiments, the optical filter may be disposed on a second surface of the template corresponding to the first surface of the template.

In example embodiments, the optical filter may include a polarizing film, a UV light-blocking film or a UV light-absorbing film.

In example embodiments, the optical filter may be formed on the second region of the template.

In example embodiments, the optical filter may be formed on the first and the second regions of the template.

In example embodiments, the optical filter may include a first optical filter having a first light transmittance and a second optical filter having a second light transmittance less than the first light transmittance.

In example embodiments, the first optical filter may be located on the first region of the template and the second optical filter may be positioned on the second region of the template.

In example embodiments, prior to contacting the first surface of the template with the photocurable coating layer, a size dispersion of the first patterns may be evaluated in different regions of the template, and the light attenuation member may be formed in a region of the template including the first patterns having a relatively large size deviation.

In example embodiments, forming the light attenuation member may include irradiating a laser beam to the region of the template.

In example embodiments, forming the light attenuation member may include attaching the light attenuation member to the region of the template.

In example embodiments, a layer to be etched may be formed on the substrate before forming the photocurable coating layer on the substrate, and the layer may be etched using the second patterns as etching masks to form the fine patterns on the substrate.

In example embodiments, the layer may include an insulation layer, a conductive layer or a semiconductor layer.

In example embodiments, a separation layer may be formed on the first surface of the template before contacting the template with the photocurable coating layer.

In the method of forming fine patterns according to example embodiments, a size dispersion degree of patterns of a template for a nanoimprint lithography may be adjusted by employing various light attenuation members in the template. As a result, fine patterns having improved size dispersion degree in a relatively large area are accurately obtained. Further, the light attenuation members may be readily provided to the template without any complicated process even though the template may include irregular patterns, so that the fine patterns may be more efficiently manufactured with relatively low cost and time.

BRIEF DESCRIPTION OF DRAWINGS

Example embodiments will be more clearly understood from the following detailed description taken in conjunction with the accompanying drawings. FIGS. 1 to 6B illustrate non-limiting, example embodiments as described herein.

FIG. 1 is a flow chart illustrating methods of forming fine patterns in accordance with example embodiments.

FIGS. 6A and 6B are cross-sectional views illustrating methods of forming fine patterns using a template including a light attenuation member having an optical filter in accordance with example embodiments.

DESCRIPTION OF EMBODIMENTS

Figure 1:
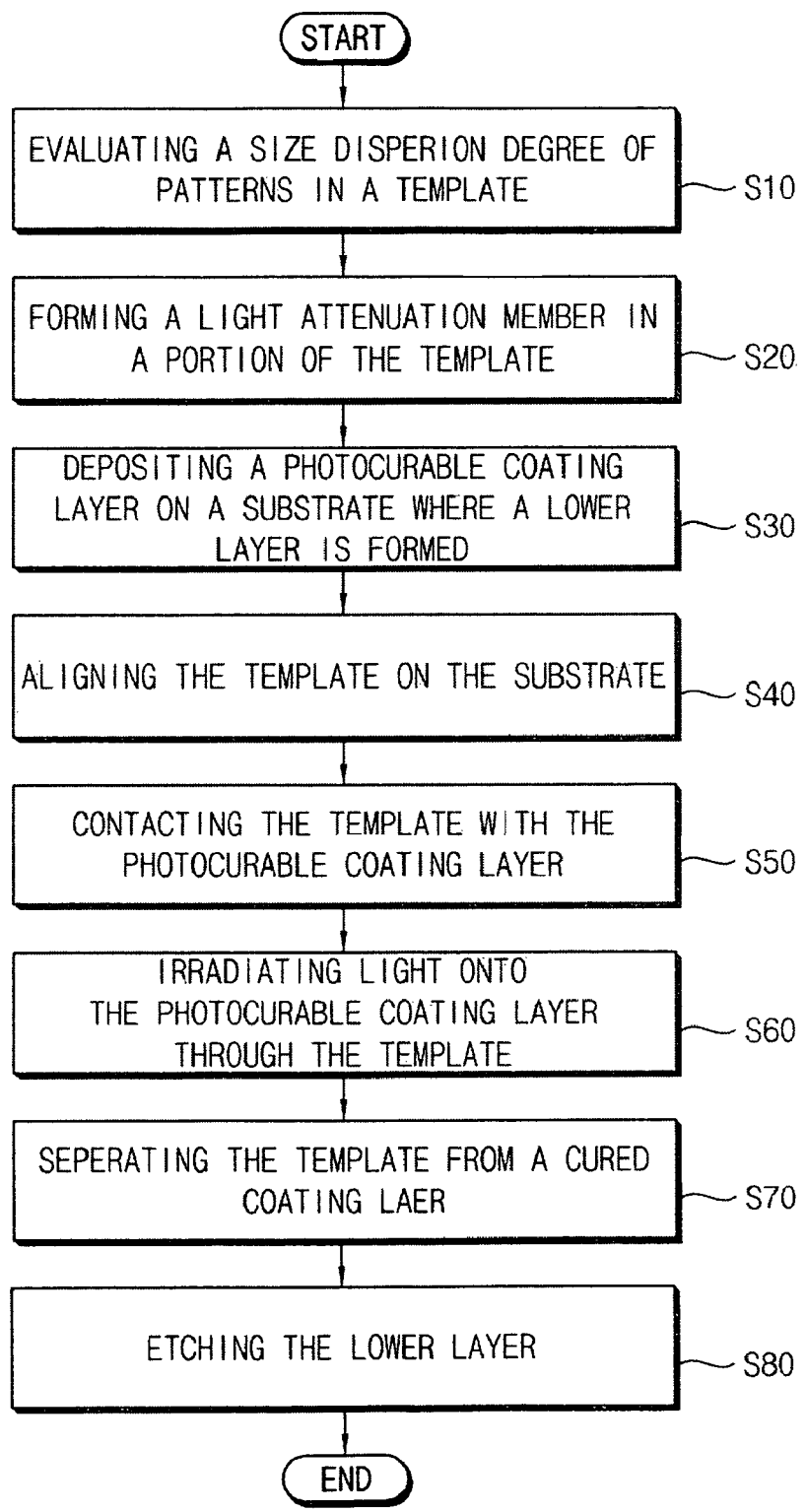

This application claims priority under 35 U.S.C. §119 to Korean Patent Application No. 2009-6772, filed on Jan. 29, 2009 in the Korean Intellectual Property Office (KIPO), the contents of which are herein incorporated by reference in their entirety.

Various example embodiments will be described more fully hereinafter with reference to the accompanying drawings, in which some example embodiments are shown. The inventive concept may, however, be embodied in many different forms and should not be construed as limited to the example embodiments set forth herein. Rather, these example embodiments are provided so that this description will be thorough and complete, and will fully convey the scope of the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating methods of forming fine patterns in accordance with example embodiments.

Referring to FIG. 1, a size dispersion degree of patterns provided on a template used in a nanoimprint lithography process is evaluated in step S10. The template may be employed in a photo nanoimprint lithography process. The template may include a transparent material, for example, glass or quartz. The patterns may be provided on one surface of the template, and the patterns on the template may be imprinted to a transfer layer in a subsequent imprinting process. A micro etching process such as an electron-beam lithography process may be performed about one surface of a transparent plate to form the template having the patterns thereon.

In forming the patterns on the template, it may be difficult to form a plurality of patterns having uniform sizes in a relatively large area of the template. For example, as illustrated FIGS. 2A and 2B, the patterns may have irregular sizes and/or irregular shapes on the template. Further, the patterns may have a predetermined size dispersion degree or size deviation degree.

Figure 2A:
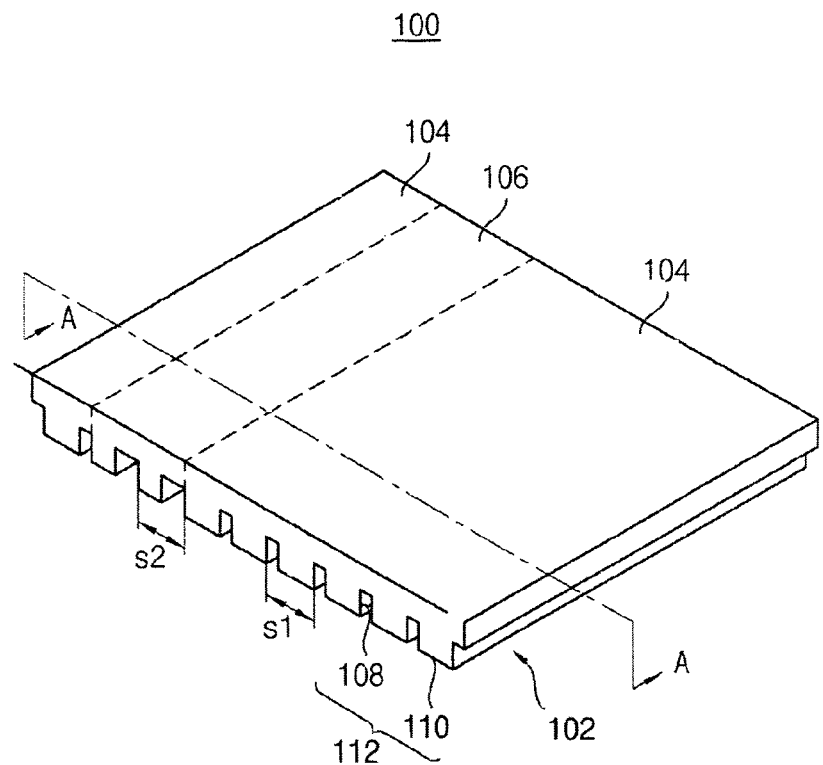
FIGS. 2A and 2B are perspective views illustrating templates including patterns having predetermined size dispersion degrees in accordance with example embodiments.
Figure 2B:
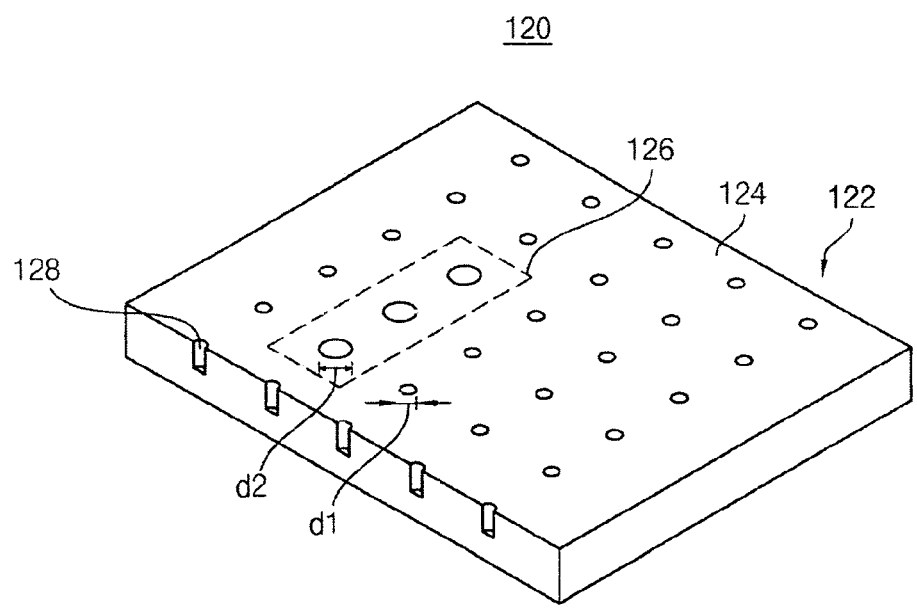

FIGS. 2A and 2B are perspective views illustrating templates including patterns having predetermined size dispersion degrees in accordance with example embodiments.

Referring to FIG. 2A, a plurality of patterns 112 are formed on a first surface 102 of a template 100. For example, at least two patterns 112 may be provided on the first surface 102 of the template 100. Each of the patterns 112 may include a concave portion 108 and a convex portion 110. The concave portion 108 and the convex portion 110 may have line shapes, respectively. In example embodiments, the first surface 102 of the template 100 may include a first region 104 and a second region 106. Alternatively, the first surface 102 of the template 100 may include a plurality of first regions 104 and a plurality of second regions 106. Each of the first and the second regions 104 and 106 may be alternately arranged.

Some of the patterns 112 disposed in the first region 104 may have first sizes (s1) substantially the same as or substantially similar to a size of a desired or reference pattern (e.g., a width or an interval of the desired or the reference pattern). That is, a size deviation between the first size (s1) and the size of the desired or the reference pattern may be relatively small. Others of the patterns 112 in the second region 106 may have second sizes (s2) substantially larger than the size of the desired or the reference pattern. That is, a size deviation between the second size (s2) and the size of the desired or the reference patterns may be relatively large. Thus, the patterns 112 in the first and the second regions 104 and 106 may have a size dispersion degree.

Referring to FIG. 2B, a plurality of patterns 128 having hole structures are formed at a first surface 122 of a template 120. For example, at least two patterns 128 of hole shapes may be provided on the first surface 122 of the template 120. The first surface 122 of the template 120 may include a first region 124 and a second region 126. Some of the patterns 128 in the first region 124 may have first diameters (d1). A size deviation between the first diameter (d1) and a diameter of the desired or the reference pattern may be relatively small. Others of the patterns 128 in the second region 126 may have second diameters (d2). Here, size deviation between the second diameter (d2) and the diameter of the desired or the reference pattern may be relatively large. Accordingly, the patterns 128 in the first and the second regions 124 and 126 may also have a size dispersion degree (i.e., a diameter dispersion degree).

When a nanoimprint lithography process is executed using one of the templates 100 and 120 including the patterns 112 and 128 having the predetermined size dispersion degrees, the size dispersion degrees of the patterns 112 and 128 may be directly transferred to fine patterns formed on a substrate. That is, the fine patterns on the substrate may have a size dispersion degree substantially the same as or substantially similar to that of the patterns 112 of the template 100 or that of the patterns 128 of the template 120. Therefore, the fine patterns may have a degraded uniformity and an irregular distribution in sizes and structures thereof.

In example embodiments, after a size dispersion degree of patterns on a template is evaluated, the size dispersion degree of the patterns may be adjusted to improve a size dispersion degree of fine patterns transferred from the patterns of the template. One surface of the template having the patterns may be scanned using a fine pattern measuring apparatus such as an electron microscope, so that widths of the patterns (or a distance between the patterns) may be measured. Then, a distribution of the patterns and a size deviation of the patterns may be calculated to thereby evaluate the size dispersion degree of the patterns.

Referring now to FIG. 1, a light attenuation member is formed at a portion of the template in step S20. The light attenuation member may partially reduce an intensity of a light passing through the template by scattering or absorbing the light. The light attenuation member may be positioned at a portion of the template where the patterns having a relatively large size deviation are formed, such that the size dispersion degree of the patterns may be adjusted. As for the template 100 illustrated in FIG. 2A or the template 120 illustrated in FIG. 2B, the light attenuation member may be disposed in the second region 106 including the patterns 112 having the relatively large size deviation or the second region 126 including the patterns 128 having the relatively large size deviation. For example, the light attenuation member may include micro bubbles capable of scattering the light or an optical filter capable of reducing the intensity of the light passing through the template 100 or the template 120.

Hereinafter, methods of forming fine patterns using a template including the light attenuation member having the micro bubbles will be described with reference to the accompanying drawings.

Figure 3A:
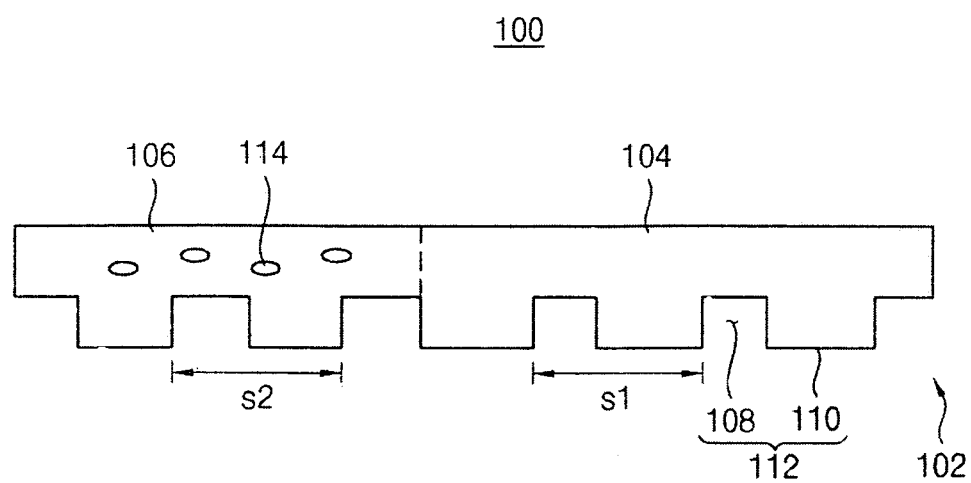
FIGS. 3A to 3C are a cross-sectional view and plan views illustrating a template including a light attenuation member having micro bubbles in accordance with example embodiments.
Figure 3B:
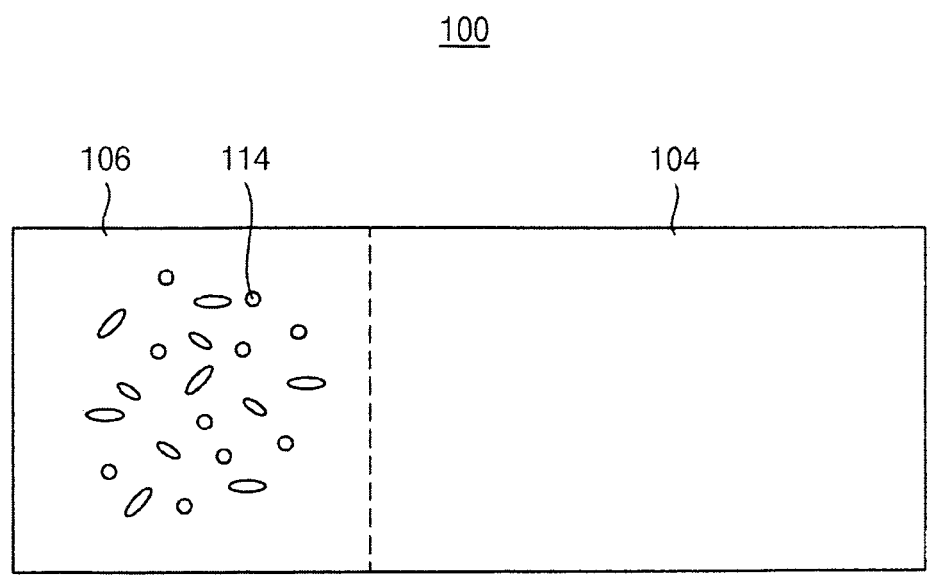
Figure 3C:
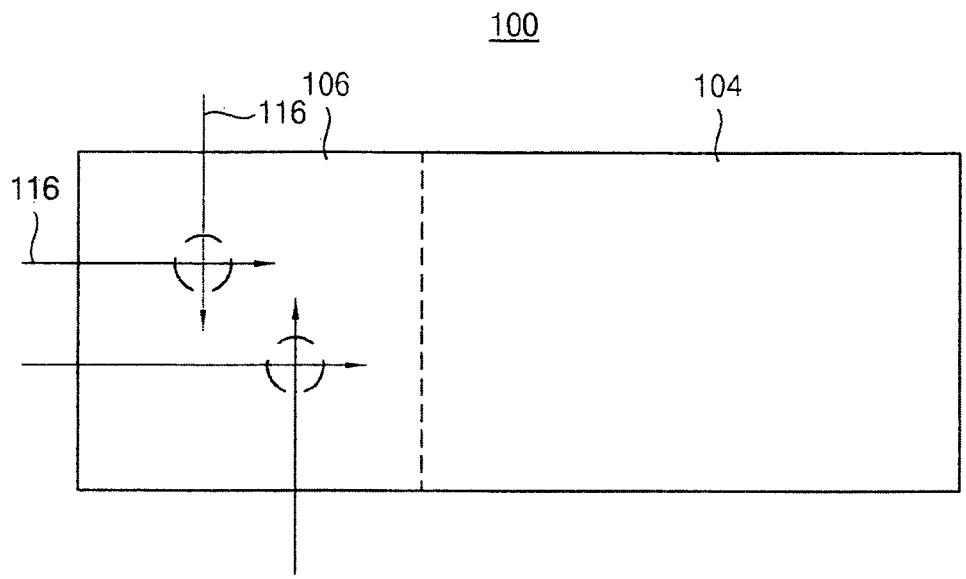

FIGS. 3A to 3C are a cross-sectional view and plan views illustrating the template including the light attenuation member having micro bubbles in accordance with example embodiments. FIG. 3A is a cross-sectional view illustrating the template taken along a line A-A' in FIG. 2A. FIGS. 3B and 3C are plan views illustrating the template in FIG. 2A.

Referring to FIGS. 3A and 3B, micro bubbles 114 may be provided in the second region 106 of the template 100 as the light attenuation member. The micro bubbles 114 may be distributed in the second region 106 of the template 100 to scatter a light passing through the second region 106 of the template 100. The second region 106 of the template 100 including the micro bubbles 114 may correspond to a region where patterns having a relatively large size deviation from the size of the desired or the reference pattern. The template 100 may include more than one second region 106 in which the patterns having the relatively large size deviation are provided.

As illustrated in FIG. 3C, the micro bubbles 114 may be generated by irradiating a laser beam 116 onto the second region 106 of the template 100. When the laser beam 116 is irradiated onto a predetermined portion of the second region 106 of the template 100, energy of the laser beam 116 may be concentrated to the predetermined portion of the template 100 so that heat is generated at the predetermined portion of the template 100. Therefore, the micro bubbles 114 may be formed at the predetermined portion of the template 100 in accordance with a partial thermal deformation of the template 100.

In example embodiments, at least two laser beams may be irradiated onto the template 100 including quartz to form the micro bubbles 114 at the predetermined portion of the template 100. Here, the laser beams may cross each other. An irradiation amount and an irradiation time of the laser beams may be controlled to properly generate the micro bubbles 114 in the second region 106 of the template 100 without causing an entire deformation of the template 100. The micro bubbles 114 may have sizes capable of scattering the light employed in curing of a resin for forming fine patterns. For example, the micro bubbles 114 may have an average size of about several nanometers to about several micrometers.

FIGS. 4A to 4D are cross-sectional views illustrating methods of forming fine patterns using a template including a light attenuation member having micro bubbles in accordance with example embodiments. In FIGS. 4A to 4D, the fine patterns may be obtained using the template 100 having the light attenuation member described with reference to FIGS. 3A to 3C, the fine patterns may be formed using a template including another light attenuation member, for example, an optical filter.

Figure 4A:
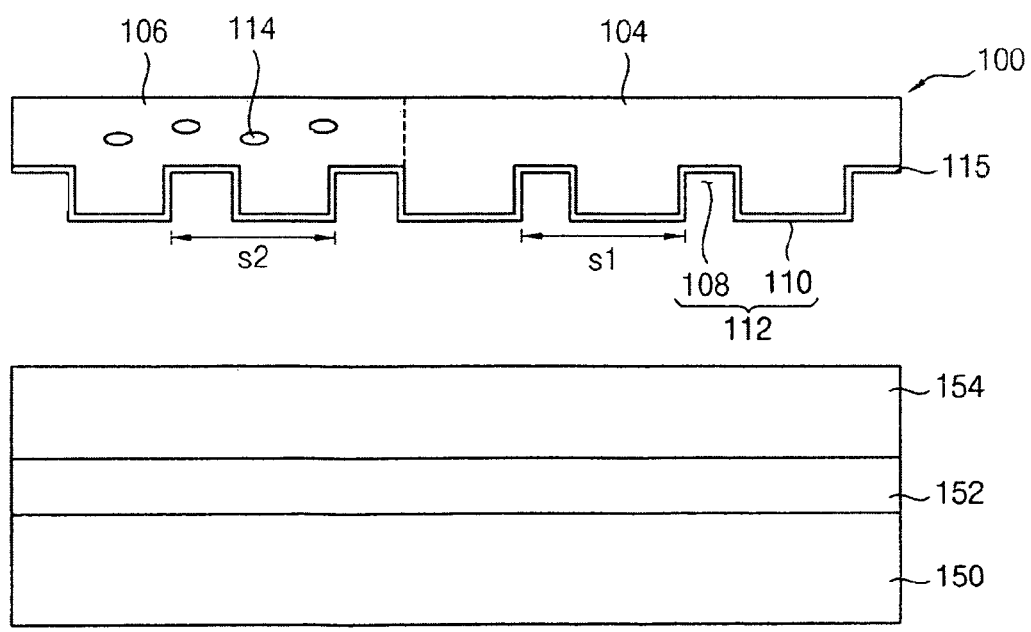
FIGS. 4A to 4D are cross-sectional views illustrating methods of forming fine patterns using a template including a light attenuation member having micro bubbles in accordance with example embodiments.

Referring to FIGS. 1 and 4A, a lower layer 152 is formed on a substrate 150, and then a photocurable coating layer 154 is formed on the lower layer 152 in step S30. The substrate 150 may include a semiconductor substrate, a substrate having a semiconductor layer, a glass substrate, a plastic substrate, a metal substrate, a ceramic substrate, etc. Examples of the semiconductor substrate may include a silicon substrate, a germanium substrate or a silicon-germanium substrate, and examples of the substrate having the semiconductor layer may include a silicon-on-insulator (SOI) substrate or a germanium-on-insulator (GOI) substrate. The lower layer 152 may be etched in a subsequent process to form the fine patterns on the substrate 150. Examples of the lower layer 152 may include an insulation layer, a conductive layer, a semiconductor layer, etc. In example embodiments, underlying structures may be formed on the substrate 150. For example, the underlying structures may include a thin layer (not illustrated), a pattern (not illustrated), a wiring (not illustrated), a semiconductor device (not illustrated), a plug (not illustrated), a contact (not illustrated), etc.

In some example embodiments, the photocurable coating layer 154 may be directly formed on the substrate 150 without interposing the lower layer 152 between the substrate 150 and the photocurable coating layer 154.

In the formation of the photocurable coating layer 154, a photocurable composition may be deposited on the lower layer 152 to form the photocurable coating layer 154. For example, the photocurable composition may be coated by a spin coating process. The photocurable composition may include an uncured liquid phase composition having a low viscosity. A light (e.g. an ultra violet (UV) light) may be irradiated onto the photocurable coating layer 154 in a subsequent process so that the photocurable coating layer 154 may be cured by the light. The photocurable coating layer 154 may be cured by polymerization and/or cross-link of polymer under action of a photo-initiator. The photocurable composition may include a resin component, for example, an unsaturated monomer, an unsaturated oligomer or an unsaturated polymer. The photocurable composition may additionally include a photo-initiator. The photocurable composition may further include a cross-linking agent, a solvent, a surfactant, etc. Examples of the unsaturated monomer may include t-butyl methacrylate, acrylate including silicon, etc.

In step S40, the template 100 is aligned relative to the substrate 150 having the photocurable coating layer 154 formed thereon. While aligning the template 100 over the substrate 150, the patterns 112 of the template 100 may be precisely positioned over the photocurable coating layer 154 considering transferring of the patterns 112 to the lower layer 152 through the photocurable coating layer 154. Hereinafter, the patterns 112 of the template 100 are referred to as first patterns 112 to discriminate transferred patterns of a cured coating layer.

In some example embodiments, a separation layer 115 may be selectively formed on the template 100 before aligning the template 100 with respect to the substrate 150. The separation layer 115 may facilitate the separation of the template 100 from the cured coating layer after the template 100 is allowed to press onto the photocurable coating layer 154.

Figure 4B:
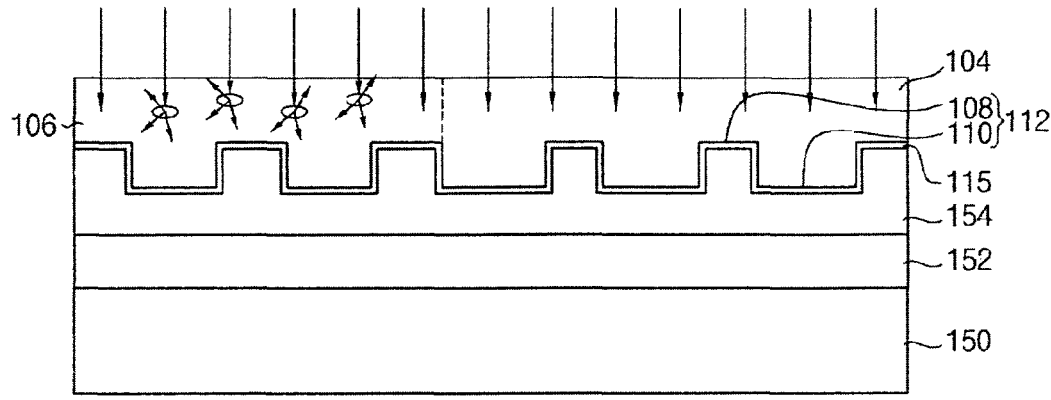

Referring to FIGS. 1 and 4B, the template 100 makes contact with the photocurable coating layer 154 in step S50. While contacting the template 100 with the photocurable coating layer 154, the template 100 and the photocurable coating layer 154 may be attached without generating any bubbles between the template 100 and the photocurable coating layer 154. The template 100 pressed to the photocurable coating layer 154 may be separated from the lower layer 152 by a predetermined distance because the photocurable coating layer 154 is interposed between the template 100 and the lower layer 152.

A light is irradiated to the template 100 and the photocurable coating layer 154 while the template 100 is pressed to the photocurable coating layer 154 in step S60. Hence, the first patterns 112 of the template 100 may be imprinted onto the photocurable coating layer 154 and the photocurable coating layer 154 may be cured.

The light, for example a UV light, provided from a light source may pass through template 100 of the transparent material to reach the photocurable coating layer 154 contacting with the first patterns 112 of the template 100. The light may pass through the first region 104 of the template 100 without an interference thereof because the first patterns 112 in the first region 104 have the relatively small size deviation. However, the light may be irregularly scattered in the second region 106 of the template 100 by the light attenuation member such as the micro bubbles 114 since the first patterns 112 in the second region 106 have the relatively large size deviation. Here, some of the light may be reflected along a direction substantially opposed to the photocurable coating layer 154 and others of the light may be irregularly scattered toward the photocurable coating layer 154. Accordingly, a light having a relatively reduced intensity may be irradiated onto a second portion of the photocurable coating layer 154 contacting the second region 106 along profiles of the first patterns 112. That is, the light having the reduced intensity may be irradiated onto the second portion of the photocurable coating layer 154 whereas the light passing through the first region 104 may be directly irradiated onto the first portion of the photocurable coating layer 154 making contact with the first region 104.

As the light is irradiated onto the photocurable coating layer 154, the photocurable coating layer 154 may be cured by polymerization thereof and/or cross-link of polymer thereof. Since an intensity of the light passing through the first region 104 of the template 100 is substantially different from an intensity of the light passing through the second region 106 of the template 100, a curing degree of the first portion of the photocurable coating layer 154 may be different from that of the second portion of the photocurable coating layer 154. Here, the first and the second portions of the photocurable coating layer 154 may correspond to the first and the second regions 104 and 106 of the template 100.

As for cure kinetics of the photocurable coating layer 154, a cure degree of the polymer in the photocurable coating layer 154 may vary in accordance with a change of the intensity of the light or the radiation amount of the light. When the radiation amount of the light is considerably less than a reference value, most of the polymer in the photocurable coating layer 154 may not be cured. When the radiation amount of the light is greater than the reference value, most of the polymer in the photocurable coating layer 154 may be cured. Thus, the cure degree of the polymer in the photocurable coating layer 154 may be controlled by changing the intensity of the light or the radiation amount of the light.

When the UV light required for polymerization and/or cross-link of polymer in the photocurable coating layer 154 is sufficiently irradiated onto the first portion of the photocurable coating layer 154 corresponding to the first region 104 of template 100, the polymer in the photocurable coating layer 154 may be sufficiently cured along the profiles of the first patterns 112 of the template 100. Thus, the first patterns 112 of the template 100 may be accurately imprinted onto the photocurable coating layer 154. Here, the transferred profiles of the photocurable coating layer 154 may be reversed relative to the profiles of the first patterns 112 of the template 100. The light may not be sufficiently irradiated onto the second portion of the photocurable coating layer 154 corresponding to the second region 106 of the template 100 along the profiles of the patterns 112 because of scattering of the light, so that the polymer in the photocurable coating layer 154 may not be sufficiently cured at portions of the photocurable coating layer 154 corresponding to boundary portions of the first patterns 112 of the template 100. Accordingly, the first patterns 112 of template 100 may be inaccurately imprinted onto the second portion of the photocurable coating layer 154. That is, the transferred profiles of the photocurable coating layer 154 may not be exactly reversed relative to the profiles of the first patterns 112 of the template 100; however, the transferred profiles of the photocurable coating layer 154 may be approximately similar to the profiles of the first patterns 112 of the template 100.

Figure 4C:
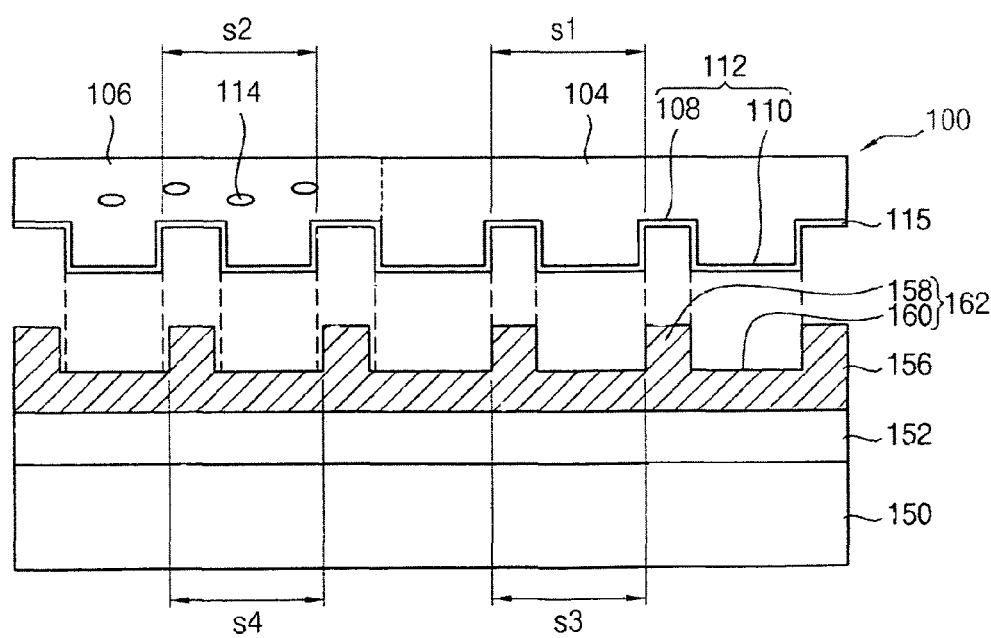
Figure 4D:
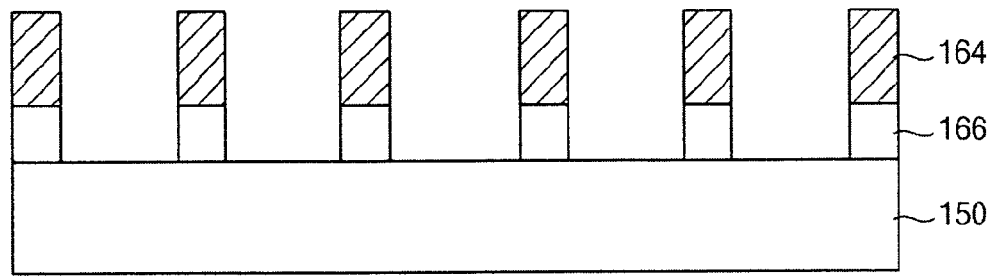

Referring to FIGS. 1 and 4C, the template 100 is separated from the substrate 150 having the cured coating layer 156 in step S70. The cured coating layer 156 may include the transferred patterns 162 (hereinafter, referred to as second patterns) on an upper surface of the cured coating layer 156. Profiles of the second patterns 162 at a second portion of the cured coating layer 156, which corresponds to the second region 106 including the patterns 112 having the relatively large size deviation, may be adjusted by the light attenuation member of the template 100. Hence, the second patterns 162 of the cured coating layer 156 may have a size dispersion degree substantially less than that of the first patterns 112 in the second region 106 of the template.

After the above-described imprinting step, the concave portion 108 and the convex portion 110 of the first patterns 112 of the template 100 may correspond to a convex portion 158 and a concave portion 160 of the second patterns 162 of the cured coating layer 156, respectively. The second patterns 162 may be more clearly and precisely imprinted at a first portion of the cured coating layer 156 corresponding to the first region 104 of the template 100, so that a size (s3) of the convex portion 158 of the cured coating layer 156 may be substantially the same as or substantially similar to the size (s1) of the concave portion 108 of the template 100. The second patterns 162 may not be sufficiently cured at the second portion of the cured coating layer 156 corresponding to the boundary portions of the first patterns 112 in the second region 106, such that a size (s4) of the convex portion 158 of the cured coating layer 156 may be substantially less than a size (s2) of the concave portion 108 of the template 100, and substantially the same as or substantially similar to the size (s3) of the convex portion 158. Accordingly, the second patterns 162 of the cured coating layer 156 may have a size dispersion degree substantially less than that of the first patterns 112 of the template 100.

Referring again to FIGS. 1 and 4D, in step S80, the lower layer 152 may be etched using the convex portion 158 of the cured coating layer 156 as an etching mask, to form lower layer patterns 166 on the substrate 150. For example, a plasma and/or reactive ions may be applied to the cured coating layer 156 so that portions of the cured coating layer 156 positioned under the concave portions 160 of the second patterns 162 may be removed to form cured coating layer patterns 164. The etching process may be carried out using the cured coating layer patterns 164 as etching mask to provide the lower layer patterns 166 on the substrate 150.

Hereinafter, other methods of forming fine patterns using templates including a light attenuation member will be described with reference to the accompanying drawings.

Figure 5A:
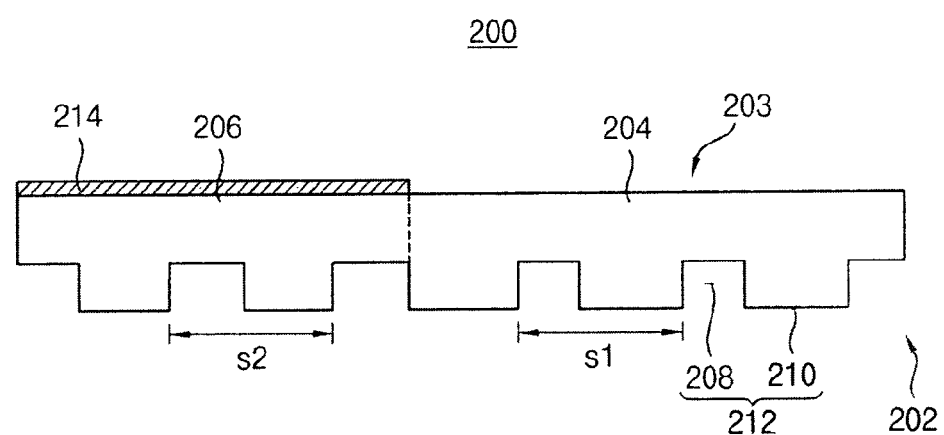
FIGS. 5A and 5B are cross-sectional views illustrating templates including light attenuation members having optical filters in accordance with example embodiments.
Figure 5B:
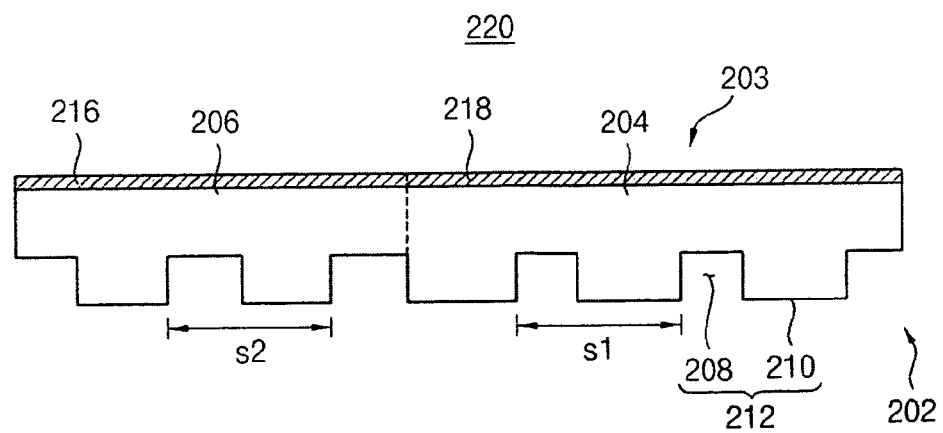

FIGS. 5A and 5B are cross-sectional views illustrating templates including light attenuation members having optical filters in accordance with example embodiments. The templates illustrated in FIGS. 5A and 5B may have constructions substantially similar to that of the template 100 described with reference to FIGS. 3A to 3C.

As illustrated in FIG. 5A, an optical filter 214 is provided on a portion of a template 200 through which a light passes. That is, the optical filter 214 may be disposed at a portion of one surface of the template 200. The template 200 may include a transparent material, for example, glass or quartz. The template 200 may have a first region 204 and a second region 206.

In example embodiments, the optical filter 214 may be positioned in the second region 206 of the template 200 where some of first patterns 212 having a relatively large size deviation are formed. Each of the first patterns 212 includes a concave portion 208 and a convex portion 210. When the template 200 has a first surface 202 and a second surface 203, the first patterns 212 may be provided on the first surface 202 whereas the optical filter 214 may be attached to the second surface 203 being facing with the first surface 202. When the light incident into the second surface 203 of the template 200 may pass through the optical filter 214, an intensity of the light may be reduced by means of scattering, absorbing or blocking the light by the optical filter 214. The optical filter 214 may include a polarizing film, a UV light blocking film, a UV light absorbing film, etc.

As illustrated in FIG. 5B, an optical filter is disposed on one whole surface of a template 220 where a light passes. The optical filter includes a first optical filter 216 and a second optical filter 218. The template 220 has a first region 204 and a second region 206. Some of first patterns 212 having a relatively small size deviation may be positioned in the first region 204 whereas others of the first patterns 212 having a relatively large size deviation may be located in the second region 206. The first optical filter 216 may be disposed in the first region 204 and the second optical filter 218 may be provided in the second region 206.

When the template 220 has a first surface 202 and a second surface 204, the first and the second optical filters 216 and 218 may be attached to the second surface 203 facing with the first surface 202 where the first patterns 212 are formed. The first optical filter 216 may have a first light transmittance and the second filter 208 may have a second light transmittance. The second light transmittance may be substantially less than the first light transmittance. Accordingly, an intensity of a light passing through the first region 204 may be different from an intensity of a light passing through the second region 206 by the first and the second optical filters 216 and 218.

Figure 6A:
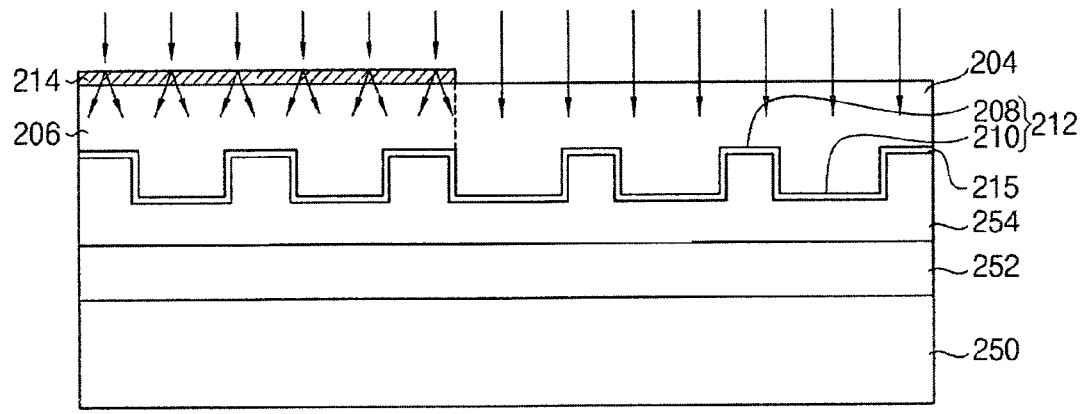
Figure 6B:
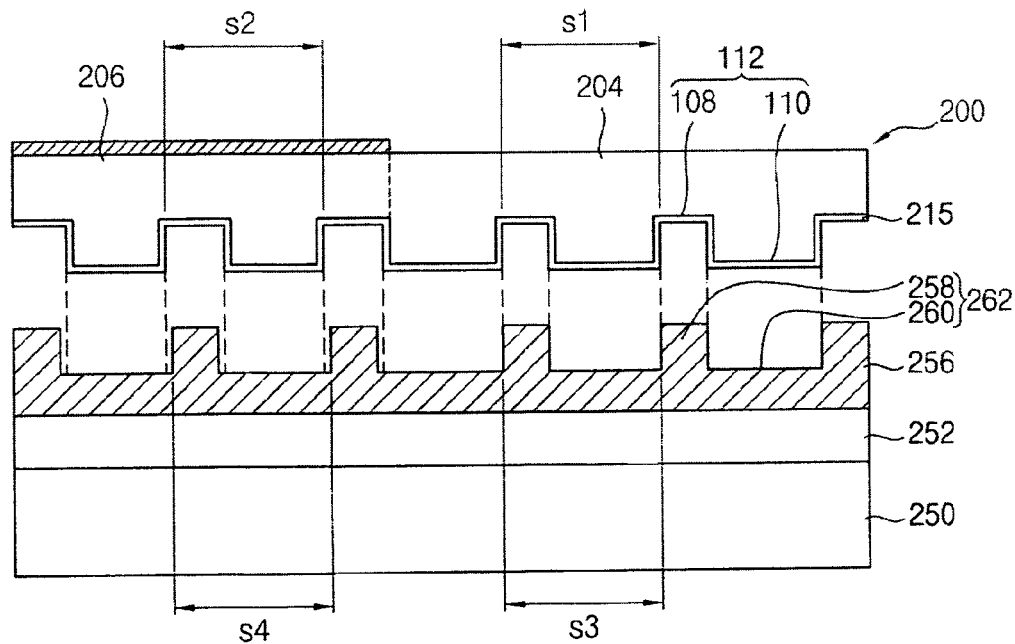

FIGS. 6A and 6B are cross-sectional views illustrating methods of forming fine patterns using a template including a light attenuation member having an optical filter in accordance with example embodiments. In FIGS. 6A and 6B, the fine patterns may be obtained using the template having the light attenuation member described with reference to FIG. 5A, the fin patterns may be formed using a template including another light attenuation member having a construction substantially the same as or substantially similar to that of the template 200 described with reference to FIG. 5B.

Referring to FIG. 6A, a photocurable coating layer 254 on a substrate 250 is contacted with one surface of a template 200 where first patterns 212 are formed. The substrate 250 may include a semiconductor substrate, a substrate having a semiconductor layer, a metal substrate, a metal oxide substrate, a ceramic substrate, etc. A lower layer 252 is interposed between the substrate 250 and the photocurable coating layer 254. In some example embodiments, a separation thin layer 215 may be selectively formed on the template 200 before contacting the photocurable coating layer 254 with the template 200.

A light is irradiated onto the photocurable coating layer 254 contacting the template 200, so that the first patterns 212 of the template 200 may be imprinted to the photocurable coating layer 254 while curing the photocurable coating layer 254. The light may pass through the template 200 without any interference of the light by a light attenuation member having the optical filter 214 in a first region 204 of the template 200. Some of the first patterns 212 having a relatively small size deviation may be disposed in the first region 204 of the template 200. A light having a relatively reduced intensity may be irradiated onto a portion of the photocurable coating layer 254 corresponding to a second region 206 of the template 200 through the optical filter 214 along profiles of the first patterns 212. Others of the first patterns 212 having a relatively large size deviation may be arranged in the second region 206 of the template 200.

As the light is irradiated onto the photocurable coating layer 254, the photocurable coating layer 254 may be cured by polymerization and/or cross-link of polymer thereof. A UV light required for polymerization or cross-link of polymer in the photocurable coating layer 254 may be sufficiently irradiated onto the photocurable coating layer 254 corresponding to the first region 204, so that the polymer in the photocurable coating layer 254 may be sufficiently cured along the profiles of the first patterns 212 of the template 200. Accordingly, the first patterns 212 of the template 200 may be accurately imprinted to the photocurable coating layer 254. Here, the first patterns 212 may be reversely imprinted to the photocurable coating layer 254. When the light is not sufficiently irradiated onto the photocurable coating layer 254 corresponding to the second region 106 of the template 200 along the profiles of the template 200 by scattering or absorbing of the light, the polymer in the photocurable coating layer 254 may not be sufficiently cured at portions of the photocurable coating layer 254 corresponding to boundary portions of the first patterns 212 of the template 200. Thus, the first patterns 212 of the template 100 may be inaccurately imprinted to the photocurable coating layer 154. Here, the transferred profiles of the photocurable coating layer 154 may not be exactly reversed with respect to the profiles of the template 200; however, the transferred profiles of the photocurable coating layer 154 may be reversely similar to the profiles of the first patterns 212 of the template 200.

Referring to FIG. 6B, the template 200 may be separated from the substrate 250 where a cured coating layer 256 is formed through processes substantially the same as or substantially similar to the above-described processes. The cured coating layer 256 may include transferred second patterns 262 from the first patterns 212 of the template 200. The second patterns 262 are located on upper surface of the cured coating layer 256. Profiles of the cured second patterns 262 in a region of the cured coating layer 256, which is corresponding to the second region 206 of the template 200 including the first patterns 212 having the relatively large size deviation, may be adjusted using the light attenuation member including the optical filter 214, such that the second patterns 162 of the cured coating layer 256 may have a size dispersion degree substantially less than that of the first patterns 212 of the template 200.

The first patterns 212 of the template 200 may be more clearly and precisely imprinted to the cured coating layer 256 corresponding to the first region 204, so that a size (s3) of a convex portion 258 of the cured coating layer 256 may be substantially the same as or substantially similar to a size (s1) of a concave portion 208 of the template 200. The portions of the photocurable coating layer 154 corresponding to the boundary portions of the first patterns 212 in the second region 206 may not be sufficiently cured, so that a size (s4) of the convex portion 258 of the cured coating layer 256 may be substantially less than a size (s2) of a concave portion 208 of the template 200 and may be substantially the same as or substantially similar to the size (s3) of the convex portion 258 of the cured coating layer 256. Accordingly, the second patterns 262 of the cured coating layer 256 may have a size dispersion degree substantially less than that of the first patterns 212 of the template 200.

Portions of the cured coating layer 256 under the concave portion 260 and the lower layer 252 are etched using the convex portion 258 of the cured coating layer 256 as an etching mask to form lower layer patterns (not illustrated) on the substrate 250. The lower layer patterns may have an improved size distribution in comparison with that of the first patterns 212 of the template 200.

According to the inventive concept, a size dispersion degree of patterns of a template for a nanoimprint lithography may be adjusted by employing various light attenuation members in the template, fine patterns having improved size dispersion degree in a relatively large area may be accurately obtained. Further, the light attenuation members may be readily provided to the template without any complicated process even though the template includes irregular patterns, so that the fine patterns may be more efficiently manufactured with relatively low cost and time.

The foregoing is illustrative of example embodiments and is not to be construed as limiting thereof. Although a few example embodiments have been described, those skilled in the art will readily appreciate that many modifications are possible in the example embodiments without materially departing from the novel teachings of example embodiments. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it may be to be understood that the foregoing may be illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming fine patterns, comprising:
   forming a photocurable coating layer on a substrate;
   contacting a first surface of a template including a light attenuation member with the photocurable coating layer, the first surface including a plurality of first patterns having a first size dispersion degree;
   irradiating a light onto the photocurable coating layer through the template to form a cured coating layer including second patterns having a second size dispersion degree, wherein the second patterns are caused from the first patterns and the second size dispersion degree is smaller than the first size dispersion degree; and
   separating the template from the cured coating layer,
   wherein the light attenuation member locally reduces an intensity of the light passing through the template, and
   wherein the light attenuation member includes micro bubbles.

2. The method of claim 1, wherein the template includes a transparent material.

3. The method of claim 2, wherein the template includes quartz or glass.

4. The method of claim 1, wherein the micro bubbles are formed by a partial deformation of the template.

5. The method of claim 1, wherein the template comprises a first region including some of the first patterns having a first size deviation and a second region including others of the first patterns having a second size deviation greater than the first size deviation.

6. The method of claim 5, the micro bubbles are disposed in the second region of the template.

7. The method of claim 1, prior to contacting the first surface of the template with the photocurable coating layer, further comprising:
   evaluating a size dispersion of the first patterns in different regions of the template; and
   forming the light attenuation member in a region of the template including the first patterns having a relatively large size deviation.

8. A method of forming fine patterns, comprising: forming a photocurable coating lager on a substrate;
   contacting a first surface of a template including a light attenuation member with the photocurable coating layer, the first surface including a plurality of first patterns having a first size dispersion degree;
   irradiating a light onto the photocurable coating layer through the template to form a cured coating layer including second patterns having a second size dispersion degree, wherein the second patterns are caused from the first patterns and the second size dispersion degree is smaller than the first size dispersion degree;
   separating the template from the cured coating layer, and
   prior to contacting the first surface of the template with the photocurable coating lager, further comprising: evaluating a size dispersion of the first patterns in different regions of the template; and
   forming the light attenuation member in a region of the template including the first patterns having a relatively large size deviation wherein forming the light attenuation member comprises irradiating a laser beam to the region of the template to form micro bubbles.

9. The method of claim 1, further comprising:
   forming a layer to be etched on the substrate before forming the photocurable coating layer on the substrate; and
   etching the layer using the second patterns as etching masks to form the fine patterns on the substrate.

10. The method of claim 9, wherein the layer includes an insulation layer, a conductive layer or a semiconductor layer.

11. The method of claim 1, further comprising forming a separation layer on the first surface of the template before contacting the template with the photocurable coating layer.

* * * * *